United States Patent
Nygren et al.

(10) Patent No.: US 6,326,843 B1
(45) Date of Patent: Dec. 4, 2001

(54) ANALOG REFLECTIVE PREDISTORTER FOR POWER AMPLIFIERS

(75) Inventors: Thorsten Nygren, Täby; Alina Oramas Alvarez, Upplands Väsby, both of (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/512,607

(22) Filed: Feb. 25, 2000

(51) Int. Cl.[7] ............................. H03F 1/26; H03F 3/60; H03F 1/36; H04K 1/02
(52) U.S. Cl. ....................... 330/149; 330/53; 330/110; 375/296; 375/297
(58) Field of Search ............................. 330/53, 110, 149; 375/296, 297

(56) References Cited

U.S. PATENT DOCUMENTS

| | | | |
|---|---|---|---|
| 4,902,983 | * 2/1990 | Fujiki et al. | 330/149 |
| 4,943,783 | * 7/1990 | Nojima | 330/149 |
| 4,987,378 | * 1/1991 | Eggleston et al. | 330/149 |
| 5,146,177 | 9/1992 | Katz et al. . | |
| 5,172,068 | 12/1992 | Childs . | |
| 5,606,286 | * 2/1997 | Bains | 330/149 |
| 5,915,213 | 6/1999 | Iwatsuki et al. . | |

FOREIGN PATENT DOCUMENTS

| | | |
|---|---|---|
| 0277636 | 10/1988 | (EP) . |
| 0844493 | 5/1998 | (EP) . |
| 2 684 820 A1 | 6/1993 | (FR) . |
| 2696295 | 1/1994 | (FR) . |

\* cited by examiner

Primary Examiner—Robert Pascal
Assistant Examiner—Patricia T. Nguyen
(74) Attorney, Agent, or Firm—Burns, Doane, Swecker & Mathis, L.L.P

(57) ABSTRACT

A reflective predistorter compensates for phase and amplitude variations imposed on an input signal by one or more non linear transfer characteristics of, for example, a power amplifier operating at or near saturation. The predistorter includes a hybrid having an input terminal, an output terminal and at least two relative phase terminals separated by 90 degrees. A first compensation circuit may be coupled to one of the relative phase terminals and may include a combination of linear and passive non-linear circuit elements. A second compensation circuit, identical to the first compensation circuit may be coupled to an other of the relative phase terminals includes a second combination of linear and passive non-linear circuit elements. The passive non-linear circuit elements may be one or more diodes and if more than one, the diodes are not configured as antiparallel. A first and second bias control circuit may be included for controlling a bias level in the first and second compensation circuit.

7 Claims, 2 Drawing Sheets

ANALOG REFLECTIVE PREDISTORTER FOR POWER AMPLIFIERS

BACKGROUND

The present invention is related to power amplifiers. In particular, the present invention is related to a predistortion circuit for linearizing power amplifiers.

With wireless communications, cable or Community Antenna Television (CATV), fiber optic, and related systems proliferating with great speed, significant related increases in associated multicarrier or other conventional applications for power amplifiers has increased. Along with the rise in such systems has been a corresponding increase in demand for efficient and linear power amplifiers for powering such systems including associated transmitters.

One basic problem in power amplifier design is the behavior of an operating power amplifier at amplitude and phase saturation levels. At such power demand levels which require power delivery at levels close to saturation, power amplifiers may experience drastic change in amplitude and phase characteristics, increasing the intermodulation (IM) distortion. It is generally desirable for power amplifiers to produce more output power and operate at higher levels of efficiency for a given level of distortion. Distortion generally arises from non-linearities associated with the transfer characteristics of the active or pass elements in the amplifier at signal frequencies. While it is possible to reduce distortion by operating amplifiers within a smaller, more linear range representing only a portion of the possible power output, it is often desirable to operate at the maximum possible output power to increase operating efficiency.

One solution to known distortion characteristics associated with an amplifier which is going to be operated outside its linear range, is to "predistort" the signal to compensate for known distortion characteristics. Such predistortion however gives rise to accompanying amplitude and phase distortion, envelope delay and the like. Many such predistorters are known.

A predistorter may generally be either of transmission or reflection type and may generally comprise a linear and a non-linear branch. By combining signals propagating through the linear and non-linear branches, both amplitude and phase variations of a power amplifier may be corrected. One such solution is suggested in the French patent application FR-2684820.

The reflective predistortion linearizer 100 described therein includes a linear and a non-linear branch, for example, as may be shown, for example, in FIG. 1. The linear branch may contain inductor 110 coupled to ground 102 which produces a reflected wave proportional to the amplitude of the incident wave input at input node 101. The second branch may include attenuator 130 together with two antiparallel schottky diodes 121 and 122 connected to ground 102, thus producing a reflective wave at combiner 140, which produces amplitude and phase deviations at higher powers due the non-linearity of the diode-resistance. The two reflective waves may be combined vectorially at combiner 140 to produce the linearizer's response and a corresponding compensated signal output at output node 141.

Problems arise however with the abovementioned linearizer. One problem is that amplitude and phase characteristics cannot be change to adapt to changing signal conditions. Another problem is that antiparallel diodes which are common in prior art linearizers are difficult to accurately bias. Still another problem is that isolators or matching networks must be used for favorable impedance matching between the amplifier circuit and the linearizer giving rise to the possibility of even more distortion and the potential need to compensate for additional transfer characteristics.

Another reflective device may be found in the prior art described in U.S. Pat. No. 5,146,177 to Katz, et al. Therein a balanced reflective nonlinear processor is described using FETs. Active FET devices are coupled to hybrid coupler 14 to perform nonlinear modification of signals. A problem arises however, in that active FET devices are more complicated to produce and operate. Katz, in fact, acknowledges the simplicity, cost, and reliability advantages of simpler solutions and further acknowledges that conventional passive solutions require additional impedance matching circuits.

Thus, it can be seen that while certain distortion problems may be addressed by the use of conventional predistorters, the difficulty posed by, for example, impedance mismatching and lack of adaptability remains inadequately addressed. It would therefore be appreciated in the art for an adaptive predistorter capable of compensating for non-linearity while avoiding the need for additional impedance matching.

SUMMARY

To allow for adaptive predistortion to be accomplished without the accompanying disadvantages and shortcomings of the prior art as described herein above, an analog reflective predistorter is described for compensating for phase and amplitude variations imposed on an input signal by one or more non linear transfer characteristics of, for example, a power amplifier operating at or near saturation.

Therefore in accordance with one embodiment of the present invention the reflective predistorter may include a hybrid having an input terminal, an output terminal and at least two relative phase terminals separated by 90 degrees to allow for a reflected signal to be directed to the output terminal. The first relative phase terminal may be coupled to a first compensation circuit and may include a first combination of linear and passive non-linear circuit elements. The second relative phase terminal may be coupled to a second compensation circuit, identical to the first compensation circuit, also including a combination of linear and passive non-linear circuit elements. It should be noted that each of the non-linear circuit elements may include one or more diodes. If more than one diode is present, then the diodes will preferably not be configured in an antiparallel fashion.

In accordance with yet another embodiment of the present invention, a first bias control circuit may be used for setting bias levels in the first compensation circuit and a second bias control circuit may further be used for setting bias levels in the second compensation circuit.

BRIEF DESCRIPTION OF THE DRAWINGS

The objects and advantages of the invention will be understood by reading the following detailed description in conjunction with the drawings, in which.

DETAILED DESCRIPTION

Figure 1:
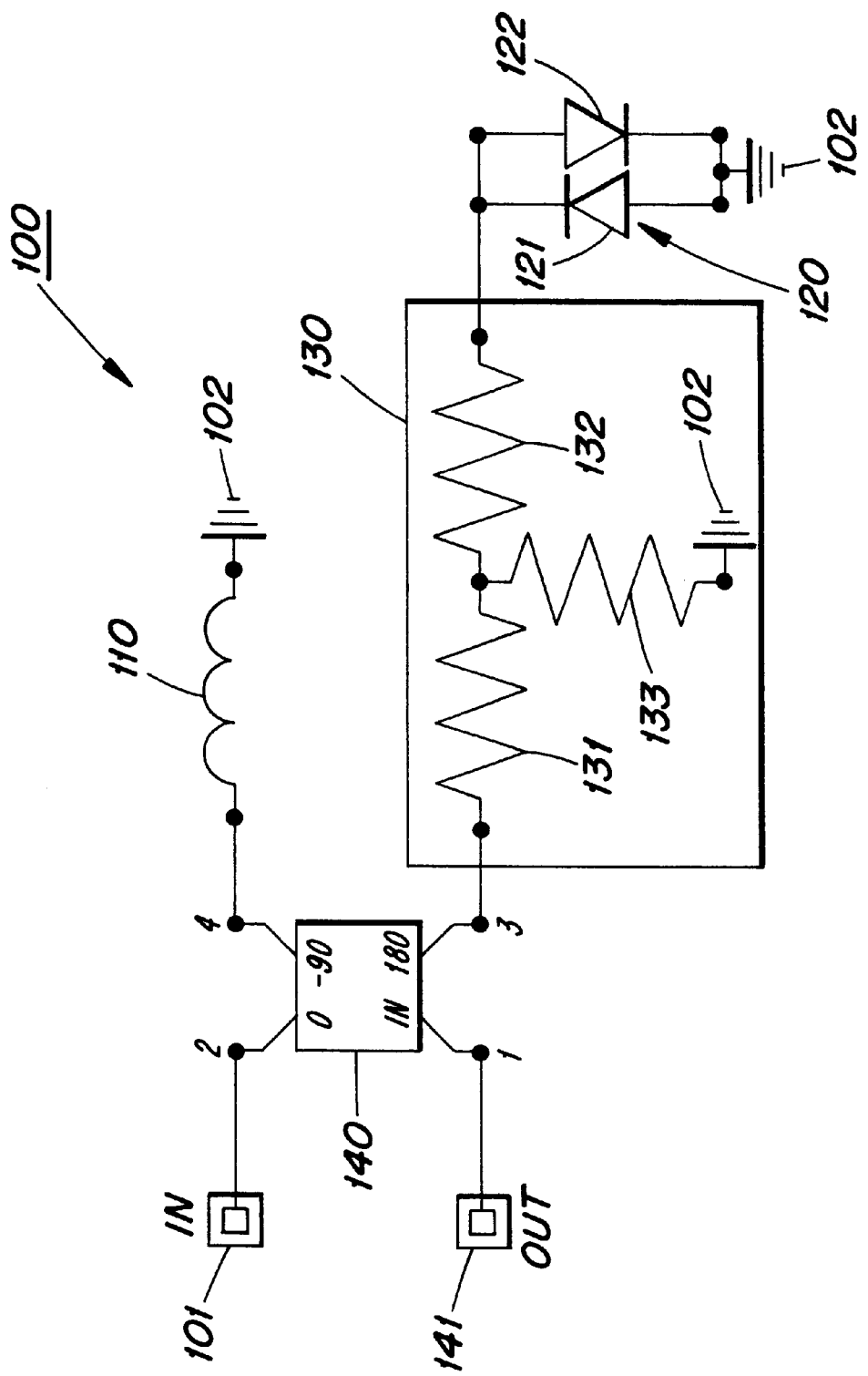
FIG. 1 is a circuit diagram illustrating an exemplary prior art linearizer.

The various features of the invention will now be described with reference to the figures, in which like parts are identified with the same reference characters.

Thus, in accordance with the present invention, an analog reflective predistorter is described providing a solution to the above mentioned problems.

Figure 2:
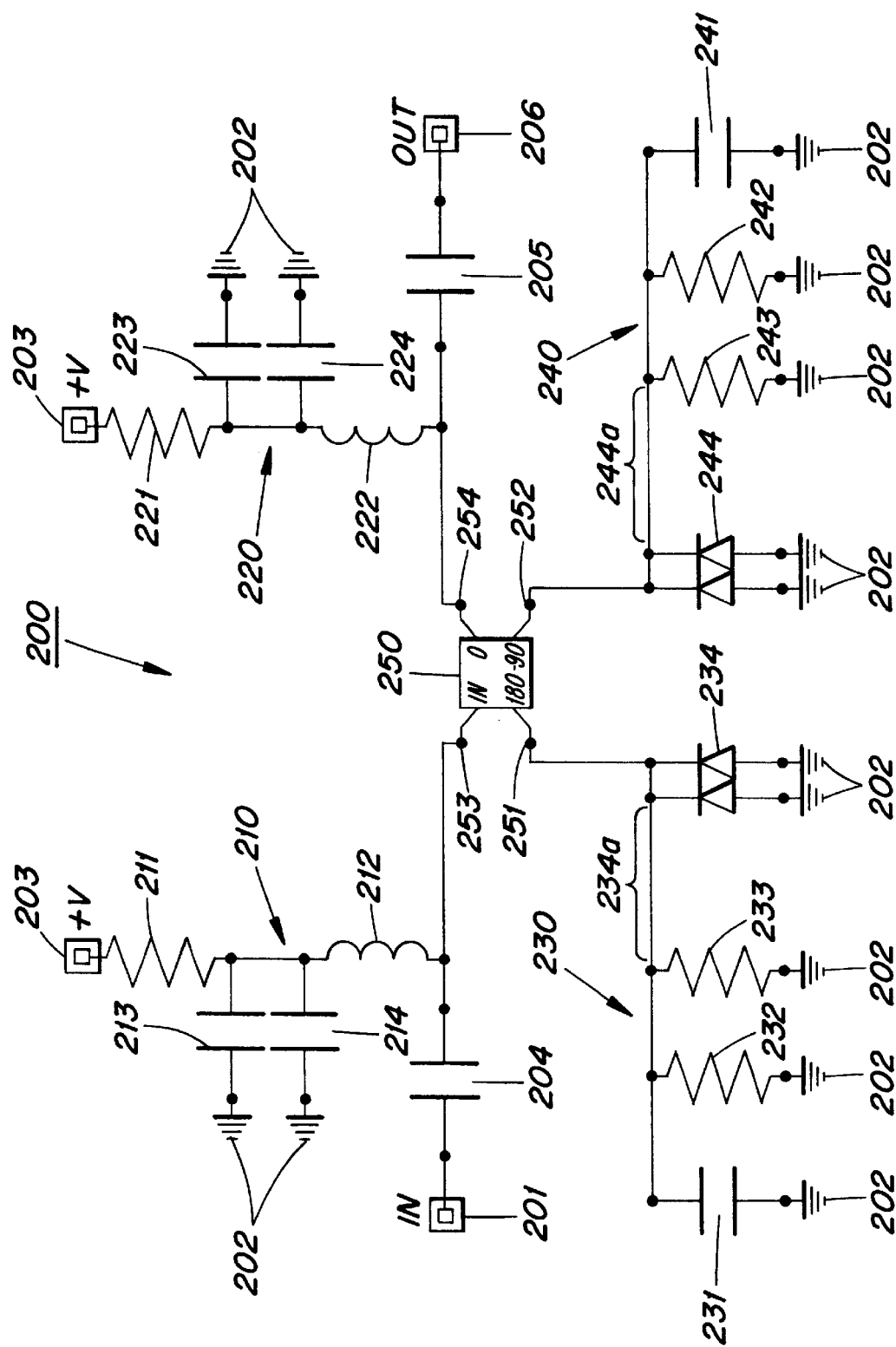
FIG. 2 is a circuit diagram illustrating an exemplary reflective predistorter circuit in accordance with the present invention.

An exemplary predistorter 200 in accordance with the present invention is illustrated in FIG. 2. In one exemplary embodiment of the present invention, problems mentioned herein above may be solved using circuit portion 230 shown coupled to a 180 degree relative phase terminal 251 of hybrid 250. It should be noted that hybrid 250 may preferably be a "90 degree" hybrid indicating that the relative phase terminals differ by 90 degrees relative. Circuit portion 230 may include passive non-linear elements such as, for example, diode pair 234, which may preferably include Schottky diodes in parallel with resistance 232 and 233 for setting DC return which is preferably low, and capacitance 231. It should further be noted that while the passive non-linear elements, e.g. diode pair 234, is shown as a pair of diodes, one or more diodes may also be used. It is also important to note that if more than one diode is used, the diode configuration will be a configuration other than anti-parallel since, while antiparallel configurations provide an effective short circuit for DC, anti-parallel configurations cannot be biased and thus cannot be matched to set the operation of the predistorter to match the point where non-linear operation of the amplifier occurs. Accordingly, in order to set bias levels such that, for example, compensation characteristics of circuit portion 230 occur at the saturation point or non-linear behavior point of the input signal or power amplifier, bias network 210 is shown coupled to input node 253 of hybrid 250 for conditioning dc bias levels associated with DC feed+V 203 for biasing circuit portion 230. It should be noted that while bias network 210 is shown coupled to input node 253, it may be coupled in different configurations to circuit portion 230 for setting the bias or operating point thereof, e.g. directly to diode pair 234.

In addition in order to provide signal reflections in accordance with the present invention, circuit portion 240, which may preferably be equal or identical to circuit portion 230, may be placed on, for example, a −90 degree relative phase terminal 252 of hybrid 250 including non-linear elements such as, for example, parallel diode pair 244, which may preferably include Schottky diodes in parallel with resistance 242 and 243, capacitance 241. As with circuit portion 230, it should be noted that diode pair 244, while the passive non-linear elements, e.g. diode pair 244, is shown as a pair of diodes, one or more diodes may also be used. It is also important to note that if more than one diode is used for the passive non-linear element, the diode configuration will be a configuration other than anti-parallel for reasons as set forth herein above with regard to diode pair 234. Accordingly, bias network 220 for conditioning dc bias levels associated with DC feed+V 203 for setting the bias levels in compensating circuit portion 240 as described above with reference to bias network 210 and circuit portion 230. Output 206 may include the predistorted signal associated with input signal 201 and may be output to, for example, an amplifier stage for subsequent amplification. It is possible in accordance with the present invention to predistort or correct for amplitude and phase distortion independently. It should be noted that factors such as, for example, the value of capacitance 231 and 241, the lengths 234a and 244a of the line between diode pairs 234 and 244 in relation to the value of resistances 232, 233, and 242, 243, may be included in determining predistorter 200's phase shift. The amplitude predistortion of predistorter 200 may be adjusted by changing the value of resistances 232, 233, and 242, 243. Moreover, both amplitude and phase predistortion may be further adjusted by changing bias values of diode pairs 234 and 244 and associated bias levels. Unlike prior art antiparallel configurations, diode pairs 234 and 244 may be accurately biased, for example, by setting DC levels in bias networks 210 and 220.

Accordingly, the combination of non-linear and linear components makes it possible to compensate both amplitude and phase using reflection from only one port. Input and output can be matched with a 90 degree hybrid or one circulator. Bias may be used to compensate for variations in amplifier characteristics with respect to temperature, materials and the like.

The invention has been described herein with reference to particular embodiments. However, it will be readily apparent to those skilled in the art that it may be possible to embody the invention in specific forms other than those described above. This may be done without departing from the spirit of the invention. Embodiments described above are merely illustrative and should not be considered restrictive in any way. The scope of the invention is given by the appended claims, rather than the preceding description, and all variations and equivalents which fall within the range of the claims are intended to be embraced therein.

What is claimed is:

1. A reflective predistorter for compensating for phase and amplitude variations on an input signal caused by one or more non-linear transfer characteristics, the predistorter comprising:

a hybrid having an input terminal, an output terminal and at least two relative phase terminals separated by 90 degrees;

a first compensation circuit coupled to one of the at least two relative phase terminals, the first compensation circuit including a first combination of linear and passive non-linear circuit elements; and a second compensation circuit, identical to the first compensation circuit, coupled to an other one of the at least two relative phase terminals, the second compensation circuit including a second combination of linear and passive non-linear circuit elements, wherein the hybrid outputs both a linear and a non-linear signal by operation of the first and second compensation circuits.

2. The reflective predistorter of claim 1, further comprising:

a first bias control circuit for controlling a bias level in the first compensation circuit; and a second bias control circuit for controlling a bias level in the second compensation circuit.

3. The reflective predistorter of claim 1 wherein the first and second non-linear circuit elements include one or more diodes, wherein if the number of the one or more diodes is more than one, then the more than one diodes are not configured in an antiparallel relation.

4. The reflective predistorter of claim 2, wherein the first and second non-linear circuit elements include one or more diodes, wherein if the number of the one or more diodes is more than one, then the more than one diodes are not configured in an antiparallel relation.

5. A method for compensating for phase and amplitude variations on an input signal caused by one or more non-linear transfer characteristics, comprising:

directing an input signal through a hybrid having an input terminal, an output terminal, and at least two relative phase terminals separated by 90 degrees;

processing the input signal through a first compensation circuit coupled to one of the at least two relative phase terminals, the first compensation circuit including a first combination of linear and passive non-linear circuit elements; and producing an output signal from a second compensation circuit, identical to the first compensation circuit, coupled to an other one of the at least two relative phase terminals, the second compensation circuit including a second combination of linear and passive non-linear circuit elements, wherein the hybrid outputs both a linear and a non-linear signal by operation of the first and second compensation circuits.

6. The method according to claim 5, further comprising:

controlling a bias level in the first compensation circuit with a first bias control circuit; and controlling a bias level in the second compensation circuit with a second bias control circuit.

7. The method according to claim 6, including adapting the output signal by adjusting the bias level with the first bias control circuit and the second bias control circuit.

* * * * *